(12) United States Patent
Feiweier

(10) Patent No.: US 10,393,843 B2
(45) Date of Patent: Aug. 27, 2019

(54) METHOD AND APPARATUS FOR ACCELERATED ACQUISITION OF MAGNETIC RESONANCE DATA

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 308 days.

(21) Appl. No.: 15/281,995

(22) Filed: Sep. 30, 2016

(65) Prior Publication Data

US 2017/0089998 A1  Mar. 30, 2017

(30) Foreign Application Priority Data

Sep. 30, 2015 (DE) .................... 10 2015 218 901
Oct. 14, 2015 (DE) .................... 10 2015 219 932

(51) Int. Cl.
*G01V 3/00* (2006.01)
*G01R 33/561* (2006.01)
*G01R 33/563* (2006.01)
*G01R 33/483* (2006.01)

(52) U.S. Cl.
CPC ..... *G01R 33/5617* (2013.01); *G01R 33/4835* (2013.01); *G01R 33/56341* (2013.01)

(58) Field of Classification Search
CPC ................................................ G01R 33/5617
USPC ............................................... 324/309, 307
See application file for complete search history.

(56) References Cited

U.S. PATENT DOCUMENTS

| 4,746,863 | A | * | 5/1988 | Crooks | .............. | G01R 33/4835 |
| | | | | | | 324/309 |
| 5,270,654 | A | * | 12/1993 | Feinberg | ............ | G01R 33/5615 |
| | | | | | | 324/307 |
| 6,600,316 | B2 | * | 7/2003 | Chen | ...................... | G01R 33/50 |
| | | | | | | 324/303 |
| 6,618,605 | B1 | | 9/2003 | Wolff et al. | | |
| 8,941,381 | B2 | * | 1/2015 | Feinberg | ............ | G01R 33/4835 |
| | | | | | | 324/307 |
| 2004/0071324 | A1 | | 4/2004 | Norris et al. | | |
| 2007/0052417 | A1 | | 3/2007 | Zhang et al. | | |

OTHER PUBLICATIONS

Listerud et al., "Oil Flair: Optimized Interleaved Fluid-Attenuated Inversion Recovery in 2D Fast Spin Echo," Magnetic Resonance in Medicine, vol. 36, pp. 320-325 (1996).

(Continued)

*Primary Examiner* — Louis M Arana
(74) *Attorney, Agent, or Firm* — Schiff Hardin LLP

(57) ABSTRACT

In a method and magnetic resonance (MR) apparatus for acquiring MR scan data of an object by execution of a scan sequence in which pulses, at least three RF pulses are radiated for generating an echo signal in a first sub-volume, at a point in time between two of the at least three RF pulses associated with the first sub-volume, at least one other RF pulse is radiated so as to generate an echo signal in another sub-volume, the other sub-volume being different from the first sub-volume. The resulting the echo signals are received and entered into k-space so as to form a datafile that is accessible for reconstructing image data of the object.

12 Claims, 3 Drawing Sheets

(56) References Cited

OTHER PUBLICATIONS

Oh et al., "An Optimized Multislice Acquisition Sequence for the Inversion-Recovery MR Imaging," Magnetic Resonance Imaging, vol. 9, pp. 903-908 (1991).

Lau et al., "Accelerated Human Cardiac Diffusion Tensor Imaging Using Simultaneous Multislice Imaging," Magnetic Resonance in Medicine, vol. 73, pp. 995-1004 (2015).

Dhital et al., "Diffusion Weighted Imaging at 7T with STEAM-EPI and GRAPPA," Proc. Intl. Soc. Mag. Reson. Med., vol. 18, p. 3994 (2010).

Sigmund et al., "Time-dependent diffusion in skeletal muscle with the random permeable barrier model (RPBM): Application to normal controls and chronic exertional compartment syndrome patients," NMR Biomed, vol. 27, Nr. 5, pp. 519-528 (2014).

Weigel, "Extended Phase Graphs: Dephasing, RF Pulses, and Echoes—Pure and Simple," Journal of Magnetic Resonance Imaging, vol. 41, pp. 266-295 (2015).

Stemmer et al., "Whole-Body STIR Diffusion-Weighted MRI in One Third of the Time," Proc. Intl. Soc. Mag. Reson. Med., vol. 21, p. 2059 (2013).

\* cited by examiner

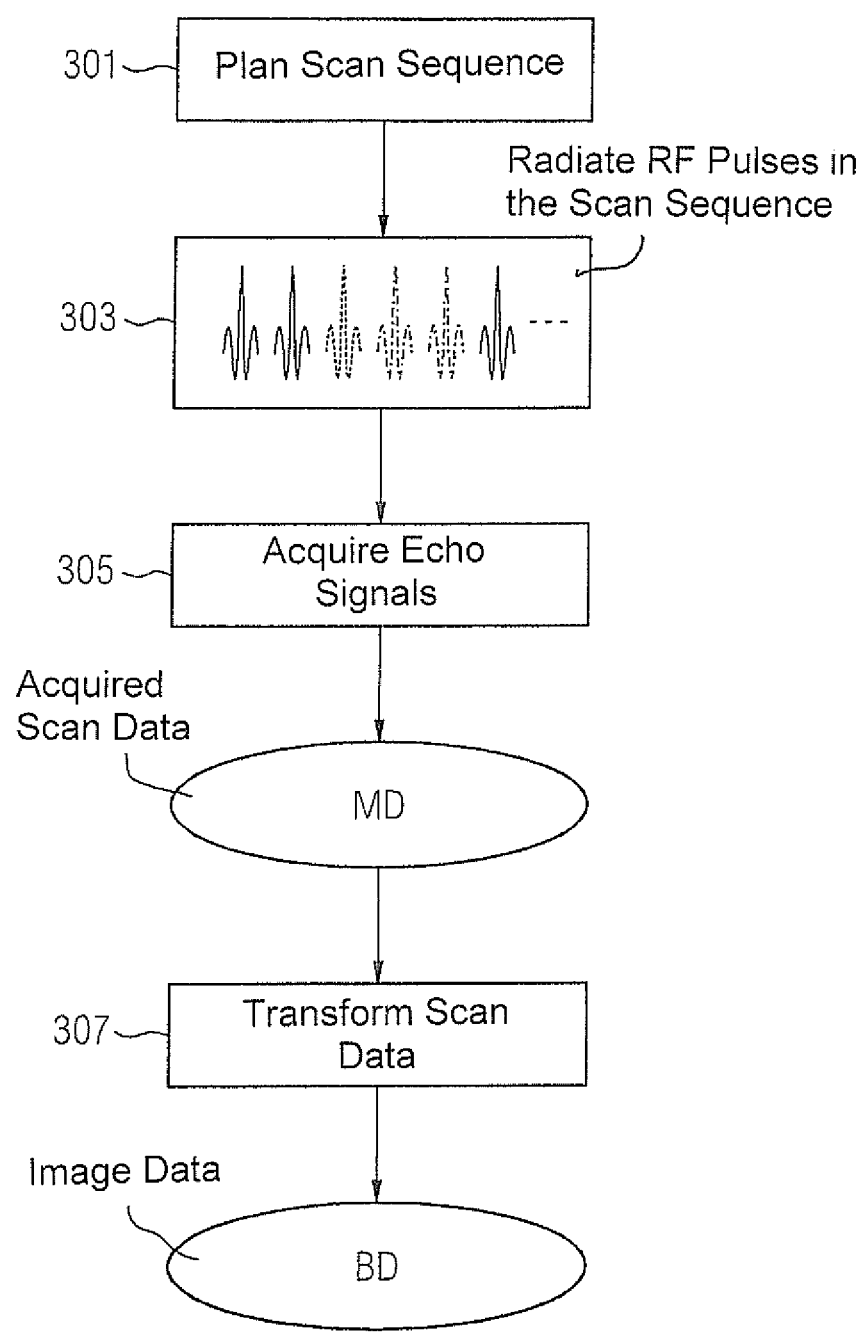

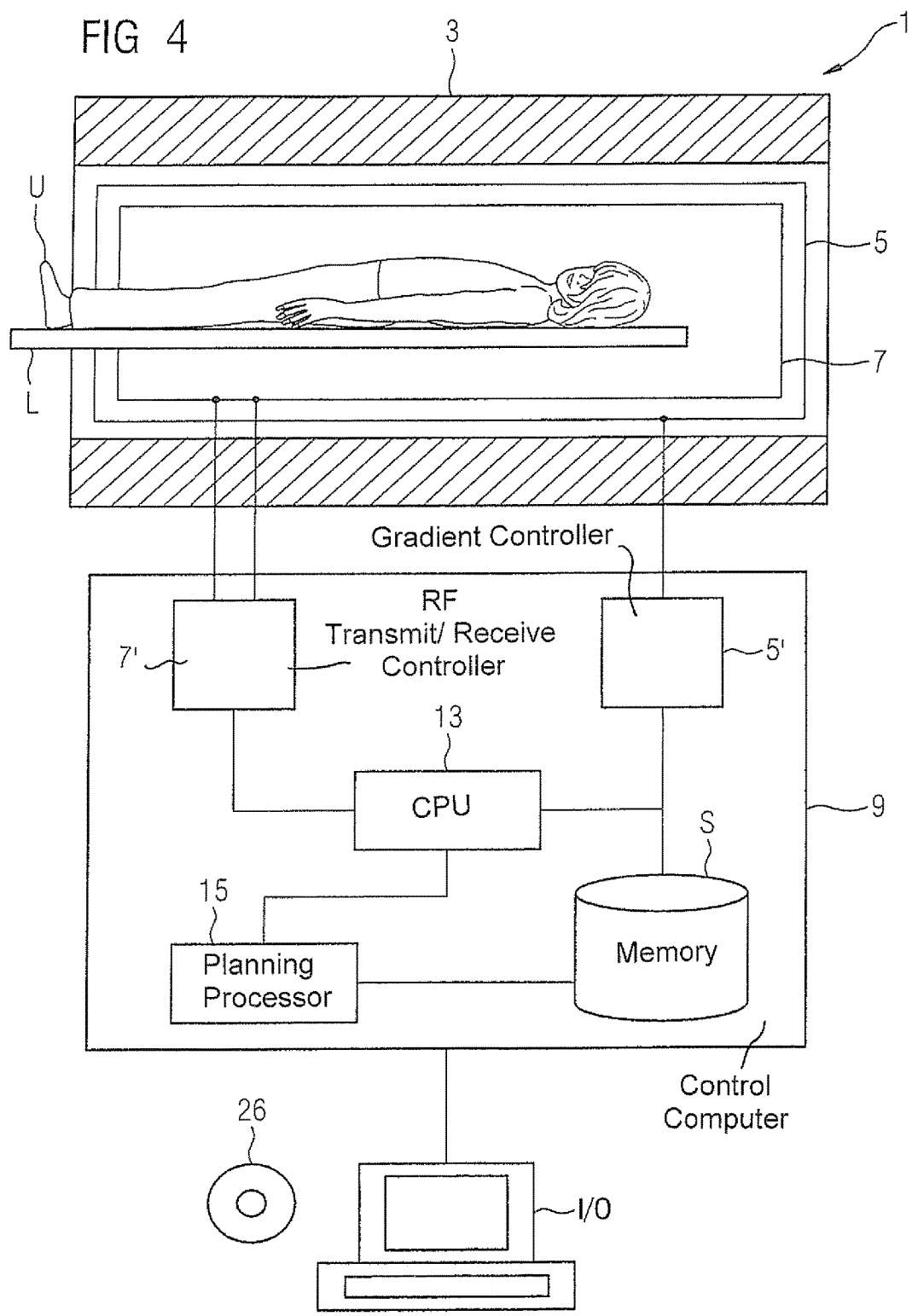

METHOD AND APPARATUS FOR ACCELERATED ACQUISITION OF MAGNETIC RESONANCE DATA

BACKGROUND OF THE INVENTION

Field of the Invention

The invention concerns a method, a magnetic resonance apparatus, and an electronically readable data storage medium for accelerated acquisition of magnetic resonance data.

Description of the Prior Art

Magnetic resonance (MR) is a well-known technique for producing images of the interior of an object. Expressed simply, the object to be imaged is positioned in a magnetic resonance scanner in a strong, static, homogeneous basic magnetic field, also known as a B0 field, having field strengths of 0.2 to 7 tesla or more, so that the object's nuclear spins align along the main magnetic field. To trigger nuclear spin resonances, radiofrequency (RF) pulses are radiated into the object e.g. for excitation or refocusing signals by the nuclear spin resonances that are triggered are measured as so-called k-space data and MR images are reconstructed or spectroscopic data obtained on the basis thereof. For spatially encoding the scan data, rapidly switched magnetic gradient fields are superimposed on the basic magnetic field. The scan data obtained are stored in a k-space matrix as complex numerical values. An associated MR image can be reconstructed from the populated k-space matrix e.g. by a multidimensional Fourier transform.

Most of the methods used in magnetic resonance systems are based on measuring echo signals produced by RF refocusing pulses (spin echo (SE) methods) or by switching echo signals produced by gradients (gradient echo (GRE) methods). The aforementioned also include methods that generate a so-called "stimulated echo" by radiation of at least three RF pulses and are therefore also known as stimulated echo methods. However, one of the disadvantages of the latter is that they require longer scan times than e.g. GRE methods or other SE methods due to the three RF pulses having to be radiated in a mutually synchronized manner.

Methods aimed at shortening the scan times include so-called parallel imaging whereby, in an EPI (echo-planar imaging) scheme, for example, the echo-planar readout train can be shortened, which not only achieves a reduction in distortion but also enables the repetition time (and therefore ultimately the scan time) to be reduced, but at the cost of simultaneously reducing the signal-to-noise-ratio (SNR). However, particularly for scans using stimulated echoes, the readout train accounts for a rather small proportion of the scan time, which means that only a small amount of scan time can be saved by parallel imaging.

Methods for reducing the scan time are also known in which several slices are excited simultaneously and the signal superimpositions in the resulting images are separated by spatial sensitivity profiles of the reception coils. Such methods are termed e.g. multiband, simultaneous multislice, or slice multiplexing techniques. An example of a simultaneous multislice method of this kind is described e.g. in the article "Accelerated Human Cardiac Diffusion Tensor Imaging Using Simultaneous Multislice Imaging", MRM 73, p. 995 (2015) by Lau et al.

Particularly in connection with MR methods that use inversion pulses to suppress unwanted signal components, such as FLAIR (fluid attenuated inversion recovery) or STIR (short TI inversion recovery), for example, methods for the interleaved application of inversion modules and acquisition modules of different slices are also known that likewise provide a reduction in scan time. Such a method is known, for example, from the article "Whole-Body STIR Diffusion-Weighted MRI in One Third of the Time", Proc. Intl. Soc. Mag. Reson. Med. 21, p. 2059 (2013) by Stemmer et al.

Using magnetic resonance techniques, specially encoded signals can also be generated and measured, allowing particular issues to be investigated. For example, MR diffusion imaging can be used to investigate issues e.g. in stroke diagnostics or planning prior to brain surgery or even for diagnosing tumors in the trunk of the body. Although spin echo based echo-planar imaging methods are used here, because they have a very good SNR per unit time, there are cases in which stimulated echo based scans are advantageous. These include, for example, examining tissue types that have very short transverse relaxation times (T2), such as muscle tissue, but also scans involving ultra-high magnetic fields (e.g. 7T or higher) for which the transversal relaxation time is generally reduced, as described e.g. in the article "Diffusion Weighted Imaging at 7T with STEAM-EPI and GRAPPA", Proc. ISMRM 18, p. 3994 (2010) by Dhital et al. Another case is for scans in which long diffusion times are deliberately examined in order to be able, for example, to analyze spatially limited movement processes. A method such as the last mentioned is described, for example, in the article "Time-dependent diffusion in skeletal muscle with the random permeable barrier model (RPBM): application to normal controls and chronic exertional compartment syndrome patients", NMR Biomed. 27, p. 519 (2014) by Sigmund et al.

There is therefore increased interest in methods based on stimulated echoes.

FIG. 1 schematically illustrates a pulse sequence diagram of the kind used in the prior art for obtaining a diffusion-weighted stimulated echo image. Shown in the top line "RF" are the RF pulses that are radiated, in the second line "Gs" the gradients to be switched in the slice selection direction, in the third line "Gr" the gradients to be switched in the readout direction, and in the last line "Gp" the gradients to be switched in the phase encoding direction. The breaks in the right-pointing arrows indicate that the duration shown is represented in truncated form. With the excitation pulse Rf1, a slice selection gradient SG is switched to limit the effect of the RF pulse RF1 on a particular slice in the imaging volume. Instead of limiting to a slice, limiting to a slab is similarly possible. After the excitation pulse RF1, diffusion encoding by encoding gradients KG takes place, followed by a second "storage" RF pulse, RF2, which again acts only on the same slice as the first RF pulse hf1 as a result of the slice selection gradient SG. This second RF pulse RF2 "stores" part of the data encoded in the generated magnetization in the form of longitudinal magnetization which decays only with longitudinal relaxation T1 in the following evolution time (i.e. much more slowly than with the transverse relaxation T2). Such so-called modulated longitudinal magnetization is described in more detail e.g. in the article "Extended Phase Graphs: Dephasing, RF Pulses, and Echoes—Pure and Simple", JMRI 41, p. 266 (2015) by Weigel. After a defined delay (mixing time TM), again with simultaneous switching of a slice selection gradient SG, a third "restoration" RF pulse RF3 restores the stored coherence to the transverse plane where, after diffusion decoding by switching of the decoding gradients DG, e.g. spatially-encoded scan data are acquired (e.g. using an echo-planar readout train GR). The purpose of the encoding and decoding gradients KG and DG is to produce a defined diffusion contrast (e.g. a particular b-value along a particular direction).

Especially when long evolution times are desired in such a stimulated echo method, and therefore the mixing time TM is selected correspondingly long, e.g. TM>100 ms, it becomes clear that a large proportion of the scan time is formed by the mixing time intervals TM.

SUMMARY OF THE INVENTION

An object of the invention is to enable scan data to be acquired in a shorter time with the use of stimulated echoes.

An inventive method for acquiring scan data of an imaged object by execution of a scan sequence that generates an echo signal in a sub-volume by radiation of at least three RF pulses has the following steps.

At least three RF pulses are radiated for generating an echo signal in a first sub-volume.

At a point in time between two of the at least three RF pulses associated with the first sub-volume, injecting at least one other RF pulse is radiated so as to generate an echo signal in another sub-volume, the other sub-volume being different from the first sub-volume.

The echo signals are acquired and entered into a memory as a k-space data, from which the k-space data are accessible as a datafile.

The invention is based on the insight that, during the mixing time of a stimulated echo experiment, the prepared spin coherences, i.e. the encoded signal, are present in the form of modulated longitudinal magnetization. This means that gradient pulses switched (activated) in this time interval have no effect on the coherence path used for imaging. Thus, RF pulses can be applied in this time that affect regions outside the prepared spin coherence, e.g. other sub-volumes, while allowing any gradient pulses to be acquired that are used e.g. for other spin coherences for slice selection, phase encoding, or frequency encoding, diffusion encoding, spoiling, etc. In addition, in this time in which only the longitudinal magnetization is relevant for generating the echo signal, scan data of other spin coherences can also be acquired, but in each case without the prepared spin coherences being impaired thereby. Therefore, at a point in time between two of the at least three RF pulses associated with the first sub-volume between which exclusively the (modulated) longitudinal magnetization is used to generate the echo signal in the first sub-volume, at least one other RF pulse can be radiated so as to generate an echo signal in another sub-volume.

At least one other RF pulse used to generate an echo signal in another sub-volume can be radiated at a point in time when a modulated longitudinal magnetization is present in the first sub-volume.

By inventively interleaving the generation and acquisition of echo signals in different sub-volumes of the imaged object, the scan time can be significantly reduced. Particularly in diffusion imaging using stimulated echoes, a reduction by a factor of two to five or more can be achieved.

A magnetic resonance apparatus according to the invention has a scanner that has a basic field magnet, a gradient coil arrangement, an RF antenna, and a control computer designed to carry out the method according to the invention.

The present invention also encompasses a non-transitory, computer-readable data storage medium encoded with programming instructions that, when the storage medium is loaded into a control computer of a magnetic resonance apparatus, cause the control computer to implement the method according to the invention when the programming instructions are executed by the control computer.

The advantages and embodiments described with reference to the method apply analogously to the magnetic resonance apparatus and to the electronically readable data storage device.

BRIEF DESCRIPTION OF THE DRAWINGS

FIG. 3 is a flowchart of the method according to the invention.

FIG. 4 is a schematic illustration of a magnetic resonance apparatus according to the invention.

DESCRIPTION OF THE PREFERRED EMBODIMENTS

Figure 2:
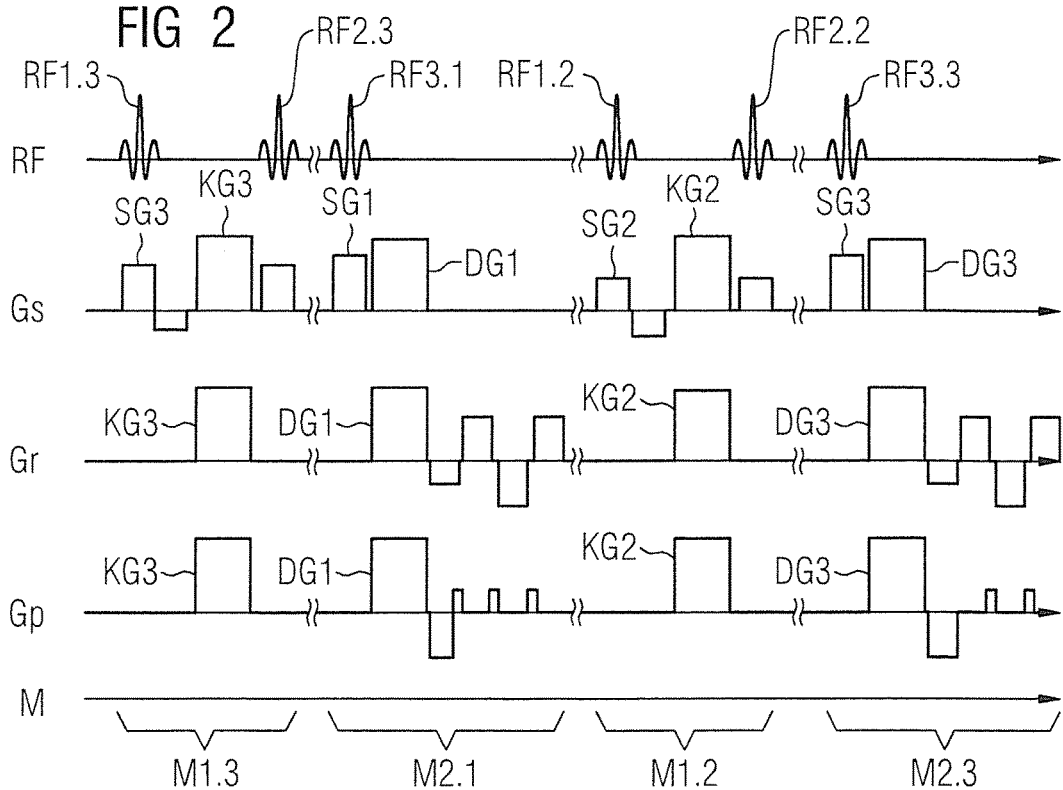
FIG. 2 shows a portion of a sequence diagram such as used for the method according to the invention.

FIG. 2 shows a portion of a sequence diagram such as can be used for the method according to the invention.

Shown in the top line "RF" are the RF pulses that are radiated in the second line "Gs" the gradients that are switched in the slice selection direction, in the third line "Gr" the gradients that are switched in the readout direction, and in the fourth line "Gp" the gradients that are switched in the phase encoding direction. In addition, the bottom line "M" indicates the modules M1.2, M1.3, M2.1, M2.3 into which the scan sequence can be subdivided that are provided as part of the scan. The breaks in the right-pointing arrows indicate that the duration shown is represented in truncated form.

At least three RF pulses RF1.$n$, RF2.$n$, RF3.$n$ are radiated into the imaged object to produce an echo signal in a sub-volume n (n=1, 2, 3, . . . ). The at least three RF pulses RF1.$n$, RF2.$n$, RF3.$n$ are, for each sub-volume n, an RF excitation pulse RF1.$n$, an RF storage pulse RF2.$n$ and an RF restoration pulse RF3.$n$.

The at least three RF pulses RF1.$n$, RF2.$n$, RF3.$n$ therefore each generate a stimulated echo signal of a sub-volume n.

Figure 1:
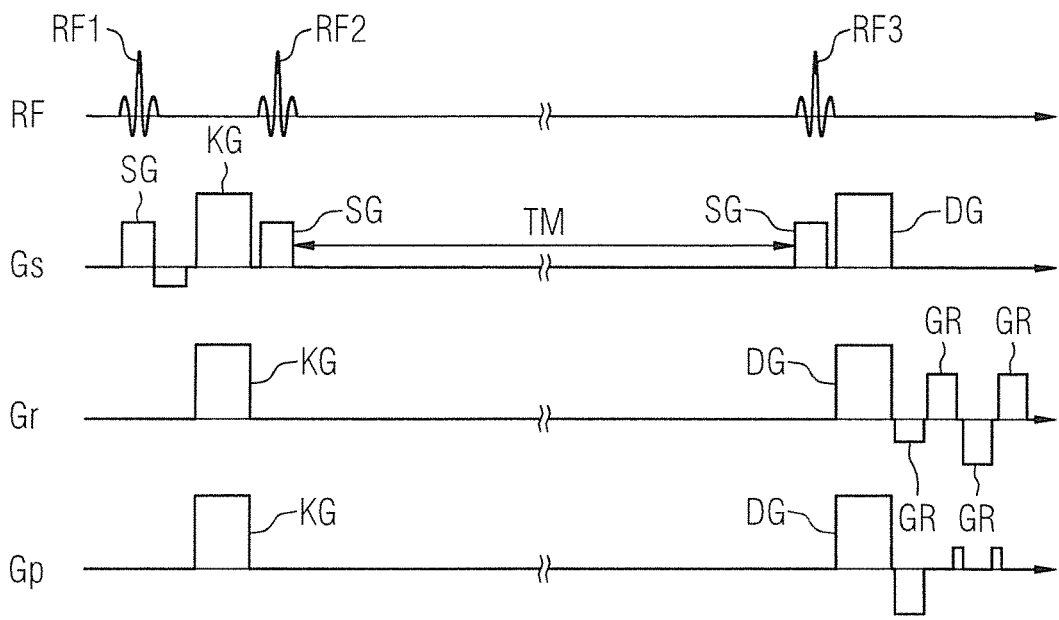
FIG. 1 shows a portion of a sequence diagram of a stimulated echo method from the prior art.

As described with reference to FIG. 1, with each RF pulse RF1.$n$, RF2.$n$, RF3.$n$ which contributes to the generation of an echo signal in a sub-volume n, a slice selection gradient SGn is switched that limits the effect of the RF pulses RF1.$n$, RF2.$n$, RF3.$n$ on the desired sub-volume, in particular a slice.

After an RF excitation pulse RF1.$n$ of a sub-volume, an encoding gradient KGn can be switched that impresses a modulation onto the magnetization of the spins excited by the excitation pulse. This modulation is stored by an RF storage pulse RF2.$n$ in the form of longitudinal magnetization, which, after a mixing time following the RF storage pulse RF2.$n$, is restored to the transverse plane by means of an RF restoration pulse RF3.$n$. In exemplary embodiments in which no encoding gradient KGn (and no decoding gradient DGn) is switched, the signal dephasing (modulation) of the spins which is caused by the slice selection gradient SGn is stored in the longitudinal magnetization.

After the RF restoration pulse RF3.$n$, possibly after switching a decoding gradient DGn, the echo signal generated can be acquired e.g. using an echo-planar acquisition train. The encoding gradient KGn can be a diffusion gradient and the decoding gradient DGn can be a diffusion decoding gradient, whereby echo signals for diffusion imaging can be generated. An echo-planar imaging sequence can be used as the scan sequence.

After an RF storage pulse RF2.3 and before an RF restoration pulse RF3.3 of a sub-volume 3, at least one other RF pulse RF3.1, RF1.2, RF2.2 is radiated so as to generate an echo signal in another sub-volume 1, 2. Between two of the at least three consecutive RF pulses RF1.3, RF2.3, RF3.3 which generate an echo signal in a first sub-volume 3, at least two other RF pulses RF3.1, RF1.2, RF2.2 can be switched which are each used to generate an echo signal in a different other sub-volume 1, 2 in each case. These sub-volumes 1, 2, 3 are different in each case.

The number of other RF pulses RF3.1, RF1.2, RF2.2 switched for other sub-volumes 1, 2 in the interval (mixing time) between an RF storage pulse RF2.3 and an RF restoration pulse RF3.3 of a sub-volume 3 can be determined automatically on the basis of the mixing time.

For this purpose the scan sequence can be subdivided into modules M1.2, M1.3, M2.1, M2.3. In particular, excitation and storage modules M1.2, M1.3 can be identified in which the RF excitation pulses RF1.$n$, the encoding gradients KGn and the RF storage pulses RF2.$n$ for a sub-volume n are contained. In addition, restoration and acquisition modules M2.1, M2.3 containing the RF restoration pulses RF3.$n$, the decoding gradients DGn and the acquisition of the scan data for each sub-volume can be identified. If required, preparation modules such as a fat suppression module, for example, can also be included in an excitation and storage module M1.2, M1.3. If the duration of the modules and mixing times are known, it is possible to determine which modules of a sub-volume can be applied in which mixing time between the modules of another sub-volume.

The modules of different sub-volumes can thus be acquired in an interleaved manner, which means that the mixing times inherent in the generation of echo signals by means of at least three RF pulses can be effectively utilized.

Optimization schemes can now be used to enable the available mixing times TM to be fully utilized. For example, optimization schemes can be used in a similar way to that described in the above mentioned article by Stemmer et al. for interleaving in the context of magnetization preparations, wherein the duration of an inversion module there would correspond to the duration of an excitation and storage module M1.2, M1.3 in the method presented here, and the duration of an imaging module there would correspond to the duration of a restoration and acquisition module in the method presented here and the inversion time TI there to the mixing time TM here.

If, for example, in the context of acquiring scan data an excitation and storage module M1.3, M1.2 takes 30 ms and a restoration and acquisition module takes 60 ms, and if 500 ms is provided for measuring an evolution time, purely mathematically up to six sub-volumes can be acquired in an optimally interleaved manner, as modules of (500 ms/(60 ms+30 ms)=5, remainder 50 ms) five other sub-volumes can be executed in the mixing time of a first sub-volume. In practice, interleaving of two to five sub-volumes will be implemented in order to meet all time planning requirements. This effectively means a reduction of the scan time by the factor quoted.

With shorter mixing times, the number of interleavable sub-volumes reduces accordingly. However, this is no disadvantage, in that shorter mixing times basically involve shorter scan times. In each case, therefore, irrespective of the mixing time, with optimally selected interleaving a best possible utilization of the scan time can be achieved by minimizing the existing mixing times in each case.

If, for particular evaluations, a variation in the mixing time, i.e. the performance of a number of scans having different mixing times is necessary, the interleaving scheme can be adapted and optimized in the described manner according to the particular scan parameters.

The method described can also be combined with known methods for reducing the scan time in order to achieve a further reduction in scan time. The scan data can be acquired using parallel imaging techniques and/or, in the context of simultaneous multislice imaging, a sub-volume can comprise at least two spatially separated subsidiary volumes.

This means that the scan time can be drastically reduced particularly in the case of diffusion imaging techniques using stimulated echoes, thereby greatly increasing the attractiveness of these methods especially in diffusion scans for short-T2 tissue, e.g. in muscle, or generally at high field strengths. The method presented also allows diffusion imaging techniques to be carried out efficiently with selective adjustment/variation of the evolution time, for analysis of e.g. limited diffusion and therefore enabling e.g. cell sizes to be inferred.

FIG. 3 is a flowchart of the method according to the invention for acquiring scan data of an imaged object by means of a scan sequence which generates an echo signal in a sub-volume by means of at least three RF pulses.

First the scan sequence can be planned (block 301). For this purpose a mixing time TM between the at least three RF pulses for generating an echo signal in a sub-volume can be determined. In addition, the parts of the scan sequence provided for generating and acquiring an echo signal in a sub-volume can be combined into modules M1.2, M1.3, M2.1, M2.3. These include excitation and storage modules M1.2, M1.3 which extend from an RF excitation pulse RF1, RF1.3, RF1.2 of a sub-volume to the end of the subsequent RF storage pulse RF2, RF2.2, RF2.3 of the same sub-volume. These also include restoration and acquisition modules M2.1, M2.3, which extend from an RF restoration pulse RF3, RF3.1, RF3.3 of a sub-volume to the end of acquisition of the same sub-volume's echo signal generated using the RF excitation pulse RF1, RF1.3, RF1.2, the RF storage pulse RF2, RF2.3, RF2.2 and the RF restoration pulse RF3, RF3.1, RF3.3. On the basis of knowledge of the mixing time TM and the respective durations of the modules M1.2, M1.3, M2.1, M2.3, it is possible to determine how many other RF pulses are to be switched for other sub-volumes in the mixing time TM, e.g. as already explained above with reference to FIG. 2.

The at least three RF pulses RF1.3, RF2.3, RF3.3 for generating an echo signal in a first sub-volume and, at a point in time between two of the at least three RF pulses associated with the first sub-volume, the at least one other RF pulse RF3.1, RF1.2, RF2.2 used to generate an echo signal in another sub-volume are radiated into the imaged object, wherein the other sub-volume is different from the first sub-volume (block 303).

The echo signals thus generated are acquired (block 305) and stored as scan data MD, for example. The acquired scan data MD can then be transformed into image data BD (Block 307).

FIG. 4 schematically illustrates a magnetic resonance apparatus 1 according to the invention. The apparatus 1 has a data acquisition scanner having a basic field magnet 3 for generating a basic magnetic field, a gradient coil arrangement 5 for generating the gradient fields, an RF antenna 7 for injecting and receiving RF signals, and a control computer 9 designed to carry out the method according to the invention. In FIG. 1, these constituents of the magnetic resonance system 1 are only shown in schematic form. For example, the RF antenna 7 can be composed of a number of sub-units, such as a number of coils, which can be designed only to transmit RF signals, or only to receive the RF signals triggered, or for both.

To scan an object U, e.g. a patient or even a phantom, the latter can be moved on an examination table L into the imaging volume of the scanner.

The control computer 9 is configured to control the magnetic resonance apparatus 1 and can control the gradient coil arrangement 5 by a gradient controller 5' and the RF antenna 7 by an RF transmit/receive controller 7'. The RF antenna 7 can incorporate a number of channels on which responsive signals can be transmitted or received.

The RF antenna 7 together with its RF transmit/receive controller 7' is responsible for generating and radiating (transmitting) an alternating RF field for manipulating the spins in the imaged object U. The center frequency of the alternating RF field, also known as the B1 field, must be close to the resonant frequency of the spins to be manipulated. To produce the B1 field, controlled currents are applied to the RF coils in the RF unit 7 by the RF transmit/receive controller 7'. For this purpose the RF transmit/receive controller 7' has a frequency synthesizer that produces a continuous sinusoidal current of a particular frequency, the center frequency. For this purpose the frequency synthesizer has an NCO (numerically controlled oscillator) with which the center frequency can be controlled. The RF transmit/receive controller 7' can also use the frequency synthesizer for receiving and demodulating the received RF signals.

The control computer 9 additionally has a planning processor 15 that is designed to carry out the method according to the invention (cf. FIG. 2). A central processing unit (CPU) 13 of the control computer 9 is designed to carry out all the computing operations required for the necessary measurements and determinations. Intermediate results and results required for this purpose or determined here can be stored in a memory S of the control computer 9. The units shown are not necessarily to be understood as physically separate entities, but merely represent a compartmentalization into functional units that can also be implemented in fewer or even in a single physical unit.

Via an input/output interface I/O of the magnetic resonance apparatus 1, control commands can be entered into the magnetic resonance apparatus 1, e.g. by a user, and/or results from the control computer 9, such as image data that has been reconstructed, can be displayed.

The method described herein can also be in the form of a computer program that causes the method by the control computer 9 when the program code of the program is executed by the control computer 9. An electronically readable data storage medium 26 has the code stored electronically readable control information.

Although modifications and changes may be suggested by those skilled in the art, it is the intention of the inventor to embody within the patent warranted hereon all changes and modifications as reasonably and properly come within the scope of his contribution to the art.

The invention claimed is:

1. A method for acquiring magnetic resonance scan data of a living patient, comprising:

operating a stationary magnetic resonance data acquisition scanner, while a living patient is situated in a receptacle of the stationary magnetic resonance data acquisition scanner, in a scan sequence including radiating at least three radio-frequency (RF) pulses that cause nuclear spins in a first sub-volume of the subject to emit an echo signal;

operating said magnetic resonance data acquisition scanner in said scan sequence to radiate, at a point in time between two of said at least three RF pulses associated with said first sub-volume, at least one further RF pulse into the living patient that causes nuclear spins in another sub-volume of the living patient to emit a further echo signal, said other sub-volume being different from said first sub-volume;

operating said magnetic resonance data acquisition scanner to acquire said echo signal and said further echo signal and entering values representing the acquired echo signal and further echo signal into a memory organized as k-space, thereby producing k-space data in said memory; and making the k-space data available from the memory in electronic form as a datafile.

2. A method as claimed in claim 1 comprising operating said magnetic resonance data acquisition scanner in said scan sequence to cause said at least three RF pulses to generate a stimulated echo in said first sub-volume.

3. A method as claimed in claim 1 comprising operating. said magnetic resonance data acquisition scanner in said scan sequence so that at least one of said three RF pulses produces a modulated longitudinal magnetization in said first sub-volume, and radiating said at least one further RF pulse to generate said echo signal in said another sub-volume at a point in time when said modulated longitudinal magnetization is present in said first sub-volume.

4. A method as claimed in claim 1 comprising operating said magnetic resonance data acquisition scanner in said scan sequence to radiate said three RF pulses as an RF excitation pulse, an RF storage pulse, and an RF restoration pulse, respectively.

5. A method as claimed in claim 4 comprising operating said magnetic resonance data acquisition scanner in said scan sequence to activate an encoding magnetic resonance field gradient, following radiation of said RF excitation pulse, that impresses a modulation on the magnetization of the nuclear spins in said first sub-volume excited by the excitation pulse, and storing said modulation by radiating said RF storage pulse and, after a mixing time following said RF storage pulse, restoring said modulation to a transverse plane by radiating said RF restoration pulse, and acquiring said echo signal from said first sub-volume after radiating said RE restoration pulse.

6. A method as claimed in claim 5 comprising operating said magnetic resonance data acquisition scanner to radiate said at least one further RF pulse into the living patient after said RF storage pulse and before said RE restoration pulse.

7. A method as claimed in claim 1 comprising operating said magnetic resonance data acquisition scanner to radiate, between two of said at least three RF pulses that produce said echo signal in said first sub-volume, at least two of said further RF pulses, each of said two further RF pulses producing an echo signal in respectively different further sub-volumes of the living patient, each of said different further sub-volumes also being different from said first sub-volume.

8. A method as claimed in claim 7 comprising, in a computer, automatically determining a mixing time between said at least three RF pulses that produce said echo signal in said first sub-volume and, dependent on the determined mixing time, selecting a number of said further RF pulses and radiating said number of further RF pulses during said mixing time.

9. A method as claimed in claim 1 comprising operating said magnetic resonance data acquisition scanner to acquire said echo signal and said further echo signal in a parallel imaging technique.

10. A method as claimed in claim 1 wherein at least one of said first sub-volume and said at least one further sub-volume comprises at least two spatially separated subsidiary volumes.

11. A magnetic resonance apparatus comprising:
a stationary magnetic resonance data acquisition scanner having a receptacle therein adapted to receive a living patient therein;
a memory;
a computer configured to operate said magnetic resonance data acquisition scanner, while the living patient is situated in said receptacle in a scan sequence including radiating at least three radio-frequency (RF) pulses into the living patient that cause nuclear spins in a first sub-volume of the living patient to emit an echo signal;
said computer being configured to operate said magnetic resonance data acquisition scanner in said scan sequence to radiate, at a point in time between two of said at least three RF pulses associated with said first sub-volume, at least one further RF pulse into the living patient that causes nuclear spins in another sub-volume of the living patient to emit a further echo signal, said other sub-volume being different from said first sub-volume;
said computer being configured to operate said magnetic resonance data acquisition scanner to acquire said echo signal and said further echo signal and to enter values representing the acquired echo signal and further echo signal into a memory organized as k-space, thereby producing k-space data in said memory; and
said computer being configured to make the k-space data available from the memory in electronic form as a datafile.

12. A non-transitory, computer-readable data storage medium encoded with programming instructions, said storage medium being loaded into a control computer of a magnetic resonance apparatus that comprises a stationary magnetic resonance data acquisition scanner having a receptacle therein adapted to receive a living patient therein, said programming instructions causing said control computer to:
operate said magnetic resonance data acquisition scanner, while the living patient is situated in said receptacle in a scan sequence including radiating at least three radio-frequency (RF) pulses into the living patient that cause nuclear spins in a first sub-volume of the subject to emit an echo signal;
operate said magnetic resonance data acquisition scanner in said scan sequence to radiate, at a point in time between two of said at least three RF pulses associated with said first sub-volume, at least one further RF pulse into the living patient that causes nuclear spins in another sub-volume of the living patient to emit a further echo signal, said other sub-volume being different from said first sub-volume;
operate said magnetic resonance data acquisition scanner to acquire said echo signal and said further echo signal and enter values representing the acquired echo signal and further echo signal into a memory organized as k-space, thereby producing k-space data in said memory; and
make the k-space data available from the memory in electronic form as a datafile.

* * * * *